(12) United States Patent
Tsukuda et al.

(10) Patent No.: US 7,525,893 B2
(45) Date of Patent: *Apr. 28, 2009

(54) ELECTRON BEAM RECORDER AND ELECTRON BEAM IRRADIATION POSITION DETECTING METHOD

(75) Inventors: Masahiko Tsukuda, Suita (JP); Shinya Abe, Kadoma (JP)

(73) Assignee: Panasonic Corporation, Osaka (JP)

( * ) Notice: Subject to any disclaimer, the term of this patent is extended or adjusted under 35 U.S.C. 154(b) by 25 days.

This patent is subject to a terminal disclaimer.

(21) Appl. No.: 12/031,416

(22) Filed: Feb. 14, 2008

(65) Prior Publication Data
US 2008/0144472 A1 Jun. 19, 2008

Related U.S. Application Data
(62) Division of application No. 10/784,391, filed on Feb. 23, 2004, now Pat. No. 7,359,305.

(30) Foreign Application Priority Data
Feb. 26, 2003 (JP) .............................. 2003-049563

(51) Int. Cl.
*G11B 7/00* (2006.01)

(52) U.S. Cl. .................... 369/101; 369/126; 369/44.23
(58) Field of Classification Search .................. 369/101
See application file for complete search history.

(56) References Cited

U.S. PATENT DOCUMENTS

| | | | |
|---|---|---|---|
| 4,961,178 | A | 10/1990 | Matsuda et al. |
| 5,270,990 | A | 12/1993 | Mizasawa et al. |
| 6,307,826 | B1 | 10/2001 | Katsumura et al. |
| 6,650,611 | B1 | 11/2003 | Kamimura et al. |
| 7,053,394 | B2 | 5/2006 | Abe |
| 2003/0007444 | A1 | 1/2003 | Tsukuda et al. |
| 2005/0232114 | A1* | 10/2005 | Tsukuda et al. ............. 369/101 |

FOREIGN PATENT DOCUMENTS
| | | |
|---|---|---|
| JP | 2002-141012 A | 5/2002 |
| JP | 2003-077189 A | 3/2003 |

\* cited by examiner

*Primary Examiner*—Jorge L Ortiz Criado
(74) *Attorney, Agent, or Firm*—RatnerPrestia

(57) ABSTRACT

An electron beam recorder includes an electron optical system for irradiating an electron beam on a master of an information recording medium and an electron beam irradiation position detecting unit for detecting an irradiation position of the electron beam in the electron optical system while the electron beam is being irradiated on the master by the electron optical system.

2 Claims, 15 Drawing Sheets

ELECTRON BEAM RECORDER AND ELECTRON BEAM IRRADIATION POSITION DETECTING METHOD

This application is a Divisional of U.S. patent application Ser. No. 10/784,391 filed Feb. 23, 2004 the entire disclosure of which is incorporated herein by reference.

BACKGROUND OF THE INVENTION

1. Field of the Invention

The present invention generally relates to electron beam recorders and electron beam irradiation position detecting methods and more particularly, to an electron beam recorder and an electron beam irradiation position detecting method, in which signals are spirally recorded on a master of an information rerecording medium such as an optical disc highly accurately.

2. Description of the Prior Art

In general, manufacture an optical disc includes a step in which by using an optical disc master recorder employing a laser or an electron beam as a light source, a master coated with photoresist is exposed and developed such that an optical disc master formed, on its surface, with concave and convex patterns such as information pits and grooves is produced, a step of producing a metallic die which has the concave and convex patterns transferred thereto from the optical disc master and is called a "stamper", a step of producing a resinous molded substrate by using the stamper and a step in which a recording film, a reflective film, etc. are formed on the molded substrate so as to be bonded to one another.

An electron beam recorder used for exposure at the time an optical disc master is produced by using an electron beam is generally arranged as follows. FIG. 15 shows an arrangement of a conventional electron beam recorder. The conventional electron beam recorder includes an electron beam source 1101 for generating an electron beam 1120 and an electron optical system 1102 which converges the emitted electron beam 1120 onto a resist master 1109 so as to record information patterns on the resist master 1109 in accordance with inputted information signals. The electron beam source 1101 and the electron optical system 1102 are accommodated in a vacuum chamber 1113.

The electron beam source 1101 is constituted by a filament for emitting electrons upon flow of electric current therethrough, an electrode for trapping the emitted electrons, an electrode for extracting and accelerating the electron beam 1120, etc. and is adapted to emit the electrons from one point.

Meanwhile, the electron optical system 1102 includes a lens 1103 for converging the electron beam 1120, an aperture 1104 for determining a beam diameter of the electron beam 1120, electrodes 1105 and 1106 for deflecting the electron beam 1120 in orthogonal directions, respectively in accordance with the inputted information signals, a shielding plate 1107 for shielding the electron beam 1120 bent by the electrode 1105 and a lens 1108 for converging the electron beam 1120 onto a surface of the resist master 1109.

Furthermore, the resist master 1109 is held on a rotary stage 1110 and is moved horizontally together with the rotary stage 1110 by a horizontally traveling stage 1111. If the master 1109 is moved horizontally by the horizontally traveling stage 1111 while being rotated by the rotary stage 1110, the electron beam 1120 can be irradiated spirally on the master 1109 so as to record the information signals of the optical disc spirally on the master 1109.

Moreover, a focusing grid 1112 is provided so as to be substantially flush with the surface of the master 1109. This focusing grid 1112 is provided for adjusting a focal position of the lens 1108 such that the lens 1108 converges the electron beam 1120 onto the surface of the master 1109. If electrons reflected by the focusing grid 1112 or secondary electrons emitted from the focusing grid 1112 upon irradiation of the electron beam 1120 on the focusing grid 1112 are detected by a detector such that a grid image is monitored, the focal position of the lens 1108 can be adjusted from a state in which the grid image is seen.

The electrode 1105 is provided for bending the electron beam 1120 in a direction substantially perpendicular to a feed direction of the horizontally traveling stage 1111. Since the electrode 1105 bends the electron beam 1120 towards the shielding plate 1107 in accordance with signals inputted to the electrode 1105, the electrode 1105 is capable of selecting whether or not the electron beam 1120 is irradiated on the master 1109 such that information pit patterns are recorded on the master 1109.

Meanwhile, the electrode 1106 is provided for bending the electron beam 1120 in a direction substantially perpendicular to that of the electrode 1105, namely, in the substantially same direction as the feed direction of the horizontally traveling stage 1111 and is capable of bending the electron beam 1120 in the substantially same direction as the feed direction of the horizontally traveling stage 1111 in accordance with signals inputted to the electrode 1106. The feed direction of the horizontally traveling stage 1111 corresponds to a radial direction of the master 1109 to be recorded. Variations of a track pitch of the optical disc, etc. can be corrected by the signals inputted to the electrode 1106.

In the optical disc, since the track pitch of information signals to be recorded is required to be recorded highly accurately, feed amount of the horizontally traveling stage 1111, nonrepeatable runout of the rotary stage 1110 or variations of irradiation position of the electron beam 1120 should be controlled with high precision. As disclosed in, for example, Japanese Patent Laid-Open Publication No. 2002-141012, error of the feed amount of the horizontally traveling stage 1110 or the like can be detected by laser measurement, etc. so as to be eliminated by driving the electrode 1106.

In the conventional electron beam recorder, even if mechanical accuracies such as the feed amount of the horizontally traveling stage 1111 and the nonrepeatable runout of the rotary stage 1110 can be corrected, position of the electron beam 1120 itself is quite likely to vary and thus, it is of vital importance to correct variations of the position of the electron beam 1120. The variations of the position of the electron beam 1120 result from great influences such as variations of magnetic field around the recorder, mechanical vibrations, acoustic noise and electrical noise of the recorder, etc. which are exerted on the electron beam 1120.

Generally, since the electron beam source 1101 and the electron optical system 1102 are accommodated in the vacuum chamber 1113, it is quite difficult to detect the variations of the position of the electron beam 1120 accelerated and converged in the vacuum chamber 1113. Meanwhile, a method may be considered in which the electron beam 1120 used for recording is irradiated on a detection object different from the master 1109, for example, the focusing grid 1112 and variations of irradiation position of the electron beam 1120 are detected by using signals of a detector for detecting an image formed on the detection object. However, this method cannot be used when signals are being recorded on the master 1109. Thus, even in this method, it is extremely difficult to detect and correct variations of the position of the electron beam 1120 when the signals are being recorded on the master 1109.

SUMMARY OF THE INVENTION

Accordingly, an essential object of the present invention is to raise, with a view to eliminating the above mentioned drawbacks of prior art, accuracy of a track pitch of an information recording medium by detecting and correcting variations of irradiation position of an electron beam during recording on a master of the information recording medium.

To this end, the present invention proposes an electron beam recorder in which an electron beam irradiation position detecting unit for detecting a quantity of an electron beam shielded partially at the time of deflection of an optical axis of the electron beam so as to be capable of detecting position of the electron beam while the electron beam is being irradiated on the master is provided in an electron optical system such that variations of the position of the electron beam can be corrected highly accurately also during recording.

In order to accomplish this end, an electron beam recorder of the present invention includes an electron optical system for irradiating an electron beam on a master of an information recording medium. An electron beam irradiation position detecting unit detects an irradiation position of the electron beam in the electron optical system while the electron beam is being irradiated on the master by the electron optical system.

BRIEF DESCRIPTION OF THE DRAWINGS

This object and features of the present invention will become apparent from the following description taken in conjunction with the preferred embodiments thereof with reference to the accompanying drawings in which.

Before the description of the present invention proceeds, it is to be noted that like parts are designated by like reference numerals throughout several views of the accompanying drawings.

DETAILED DESCRIPTION OF THE INVENTION

Hereinafter, embodiments of the present invention are described with reference to the drawings.

First Embodiment

Figure 1:
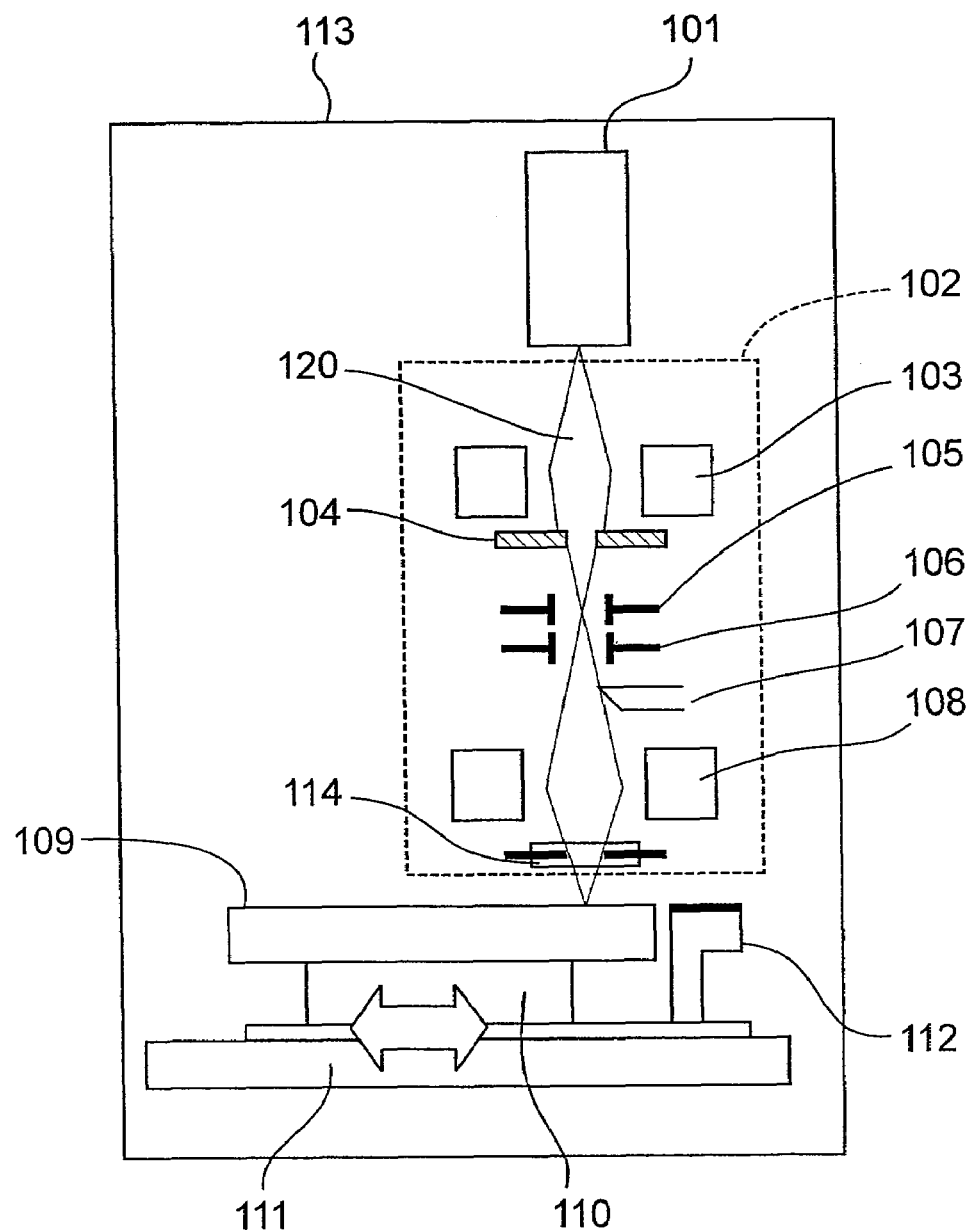
FIG. 1 is a schematic sectional view showing an arrangement of an electron beam recorder according to a first embodiment of the present invention.

FIG. 1 shows an arrangement of an electron beam recorder for recording signals on a master 109 of an information recording medium, for example, an optical disc by using an electron beam 120, according to a first embodiment of the present invention. This electron beam recorder has a following arrangement portion similar to that of a conventional electron beam recorder of FIG. 15. Namely, this electron beam recorder includes an electron beam source 101 for generating an electron beam 120 and an electron optical system 102 which converges the emitted electron beam 120 onto the resist master 109 so as to record information patterns on the resist master 109 in accordance with inputted information signals. The electron beam source 101 and the electron optical system 102 are accommodated in a vacuum chamber 113.

The electron beam source 101 is constituted by a filament for emitting electrons upon flow of electric current therethrough, an electrode for suppressing the emitted electrons, an electrode for extracting and accelerating the electron beam 120, etc. and is adapted to emit the electrons from one point.

Meanwhile, the electron optical system 102 includes a lens 103 for converging the electron beam 120, an aperture 104 for determining a beam diameter of the electron beam 120, electrodes 105 and 106 for deflecting the electron beam 120 in orthogonal directions, respectively in accordance with the inputted information signals, a shielding plate 107 for shielding the electron beam 120 bent by the electrode 105 and a lens 108 for converging the electron beam 120 onto a surface of the resist master 109.

Furthermore, the resist master 109 is held on a rotary stage 110 and is moved horizontally together with the rotary stage 110 by a horizontally traveling stage 111. If the master 109 is moved horizontally by the horizontally traveling stage 111 while being rotated by the rotary stage 110, the electron beam 120 can be irradiated spirally on the master 109 so as to record the information signals of the optical disc spirally on the master 109.

Moreover, a focusing grid 112 is provided so as to be substantially flush with the surface of the master 109. This focusing grid 112 is provided for adjusting a focal position of the lens 108 such that the lens 108 converges the electron beam 120 onto the surface of the master 109. If electrons reflected by the focusing grid 112 or secondary electrons emitted from the focusing grid 120 upon irradiation of the electron beam 120 on the focusing grid 112 are detected by a detector such that a grid image is monitored, the focal position of the lens 108 can be adjusted from a state in which the grid image is seen.

Figure 2:
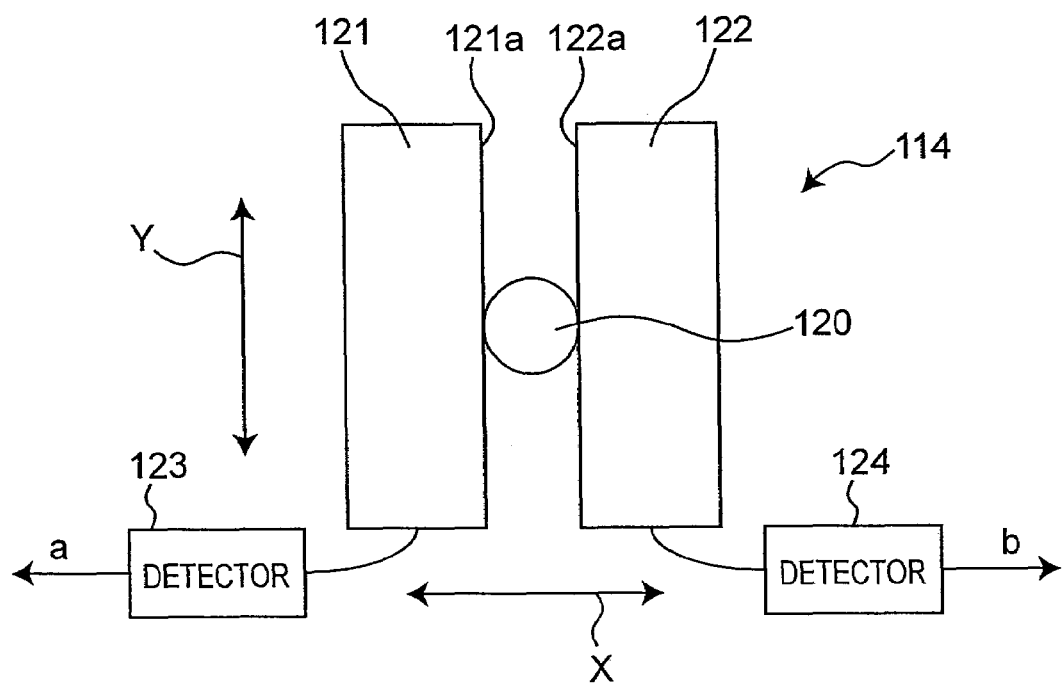
FIG. 2 is a top plan view showing an arrangement of an electron beam irradiation position detecting unit of the electron beam recorder of FIG. 1.
Figure 15:
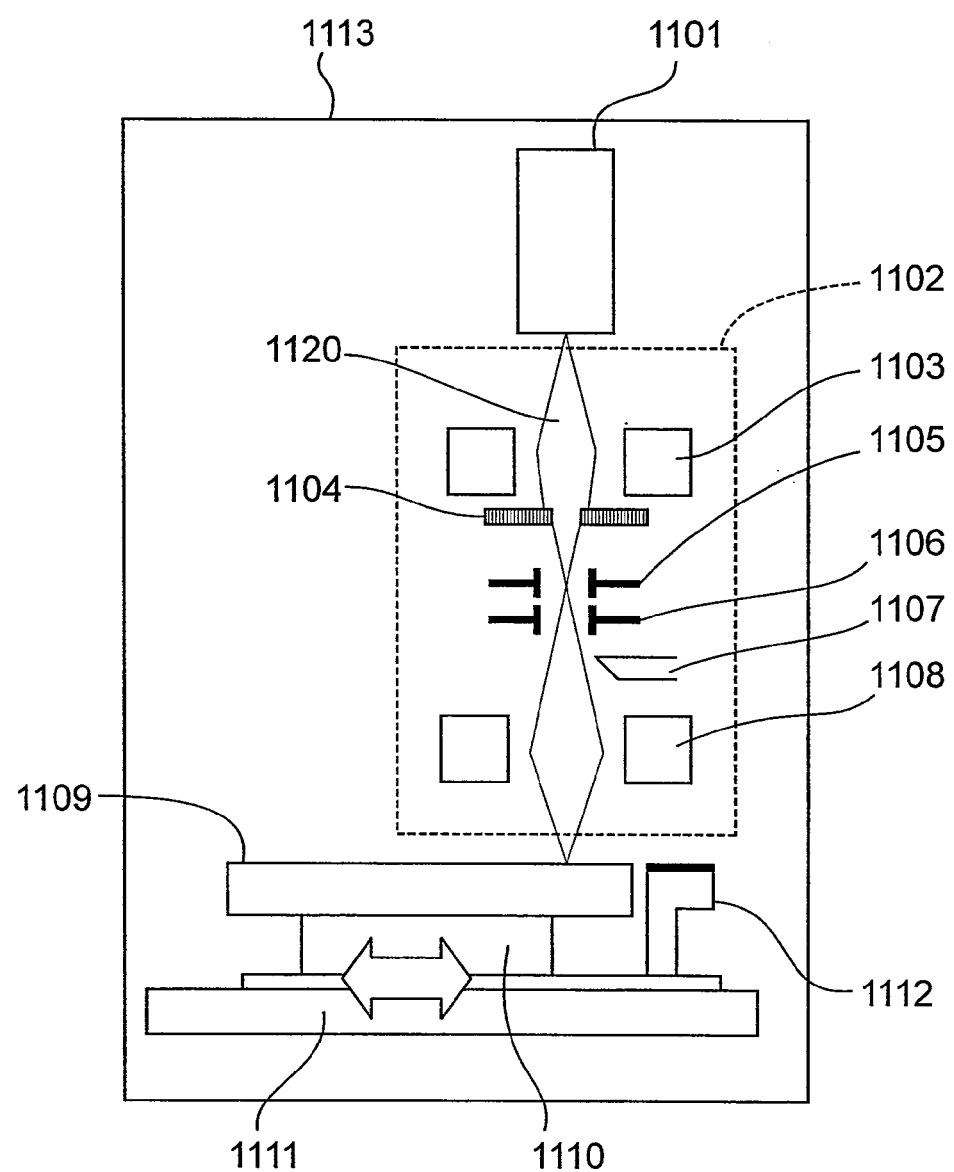
FIG. 15 is a schematic sectional view showing an arrangement of a prior art electron beam recorder.

In the present invention, an electron beam irradiation position detecting unit 114 for detecting a position of the electron beam 120 passing therethrough is provided in the electron optical system 102 and below the lens 108 in addition to the above mentioned arrangement portion similar to that of the conventional electron beam recorder of FIG. 15. This electron beam irradiation position detecting unit 114 is arranged as follows. FIG. 2 is a top plan view of the electron beam irradiation position detecting unit 114 as observed from the electron beam source 101. In the electron beam irradiation position detecting unit 114 shown in FIG. 2, shielding plates 121 and 122 are, respectively, provided at opposite sides of the electron beam 120 passing through the electron beam irradiation position detecting unit 114. The shielding plates 121 and 122 have, respectively, linear edges 121a and 122a extending in a direction substantially perpendicular to a feed direction X of the horizontally traveling stage 111, namely, in a rotational direction Y of the master 109. The shielding plates 121 and 122 are provided such that the respective edges 121a and 122a are substantially brought into contact with the electron beam 120.

Meanwhile, electron beam detectors 123 and 124 are, respectively, connected to the shielding plates 121 and 122 so as to output signals a and b proportional to quantities of the electron beam 120 irradiated on the shielding plates 121 and 122, respectively. Thus, when the electron beam 120 has been deflected in the feed direction X of the horizontally traveling stage 111 due to variations of ambient magnetic field or mechanical vibrations and electrical noise of the electron beam recorder, a portion of the electron beam 120 is irradiated on the shielding plate 121 or 122, so that the signals a and b corresponding to the quantities of the electron beam 120 irradiated on the shielding plates 121 and 122 are, respectively, outputted from the electron beam detectors 123 and 124 provided for the shielding plates 121 and 122, respectively.

Figure 3:
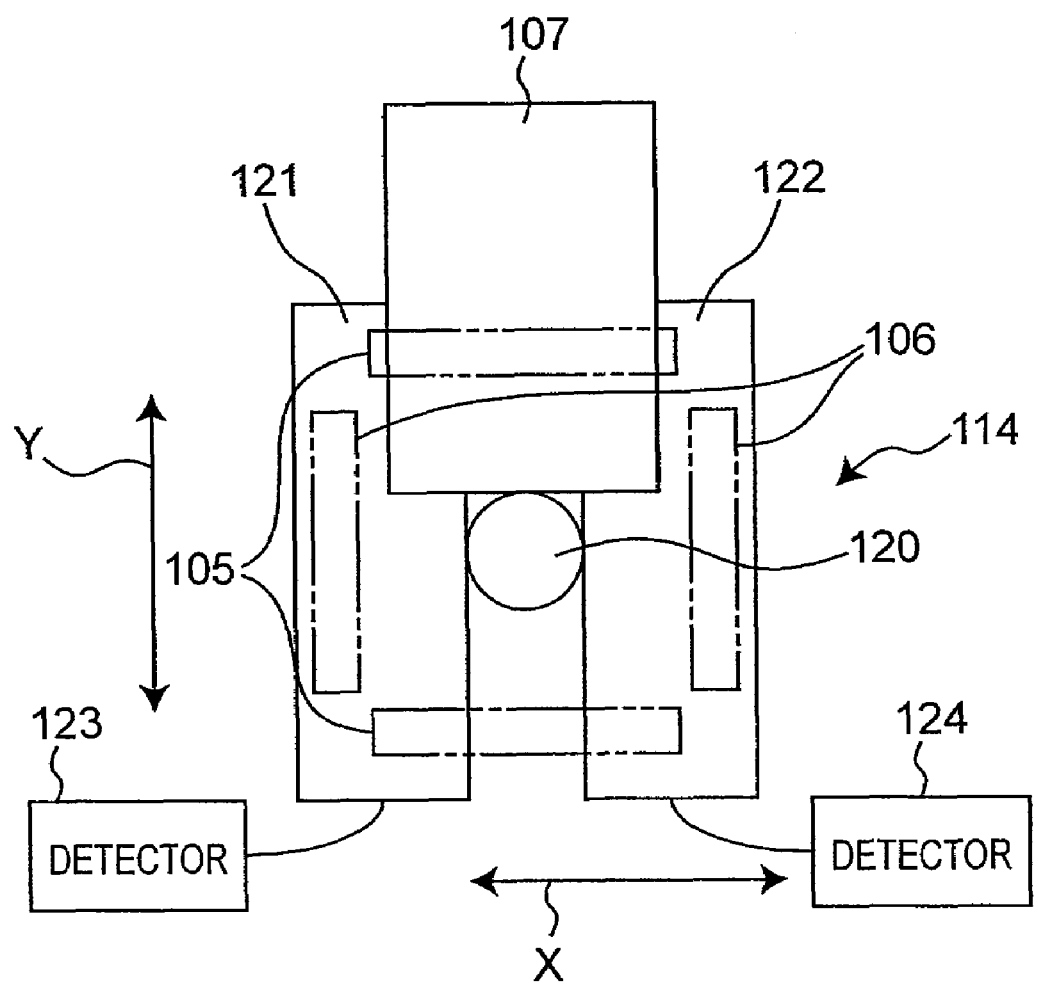
FIG. 3 is a top plan view showing relative positions of electrodes, a shielding plate and the electron beam irradiation position detecting unit of FIG. 2 in the electron beam recorder of FIG. 1.

FIG. 3 illustrates relative positions of the electrodes 105 and 106, the shielding plate 107 and the electron beam irradiation position detecting unit 114. As shown in FIG. 3, the electrode 105 is formed by a pair of electrode portions interposing the electron beam 120 therebetween and is provided so as to bend the electron beam 120 in the direction substantially perpendicular to the feed direction X of the horizontally traveling stage 111, i.e., in the rotational direction Y of the master 109. The electrode 105 is capable of bending the electron beam 120 towards the shielding plate 107 in accordance with signals inputted to the electrode 105 so as to select whether or not the electron beam 120 is irradiated on the master 109 such that information pit patterns are recorded on the master 109.

Meanwhile, in FIG. 3, the electrode 106 is formed by a pair of electrode portions interposing the electron beam 120 therebetween and is provided for bending the electron beam 120 in a direction substantially perpendicular to that of the electrode 105, i.e., in the substantially same direction as the feed direction X of the horizontally traveling stage 111 and is capable of bending the electron beam 120 in the substantially same direction as the feed direction X of the horizontally traveling stage 111 in accordance with signals inputted to the electrode 106. Since the feed direction X of the horizontally traveling stage 111 corresponds to a radial direction of the master 109 to be recorded, variations of a track pitch of the optical disc, etc. can be corrected by the signals inputted to the electrode 106.

Figure 4:
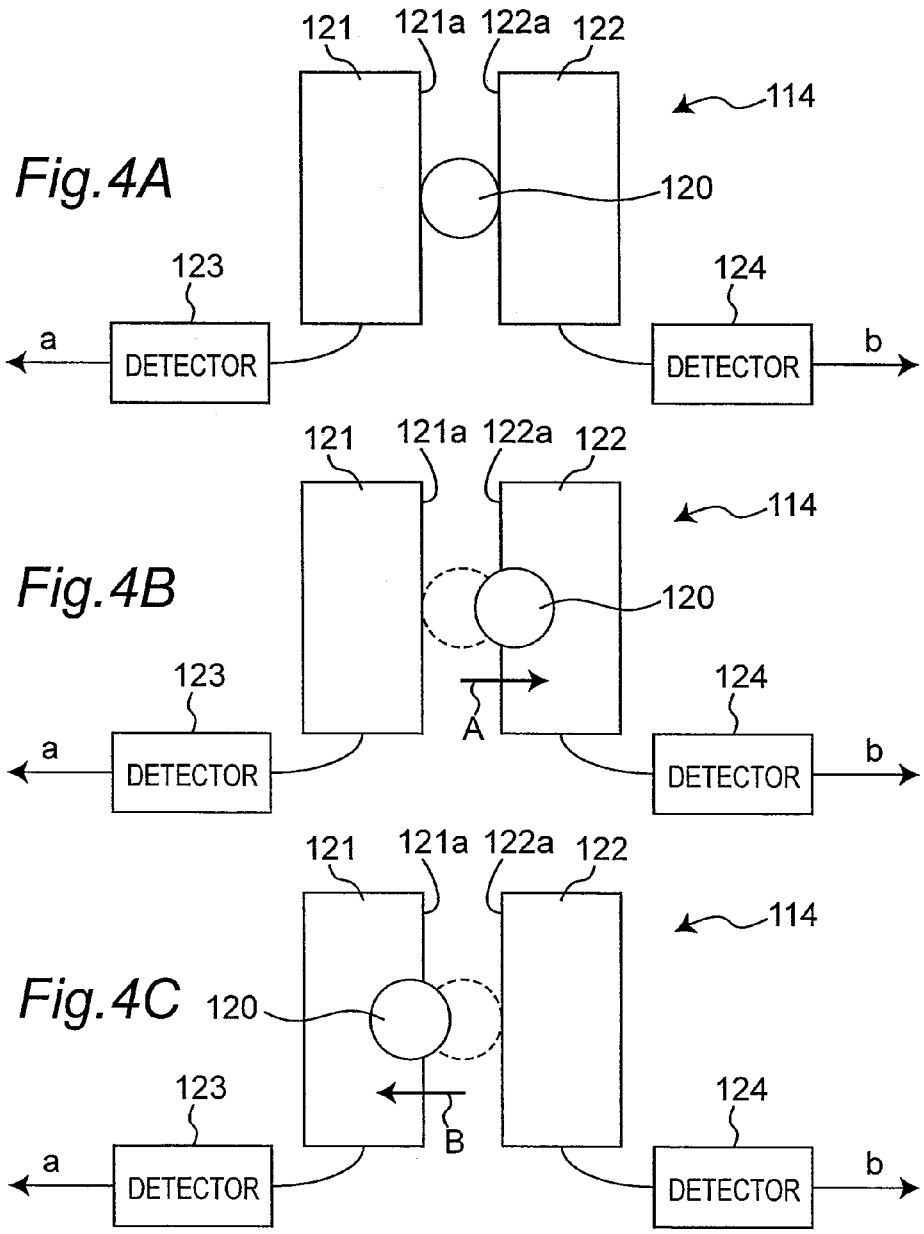
FIGS. 4A, 4B and 4C are top plan views showing a normal position and deflections of an electron beam in the electron beam irradiation position detecting unit of FIG. 2.
Figure 5:
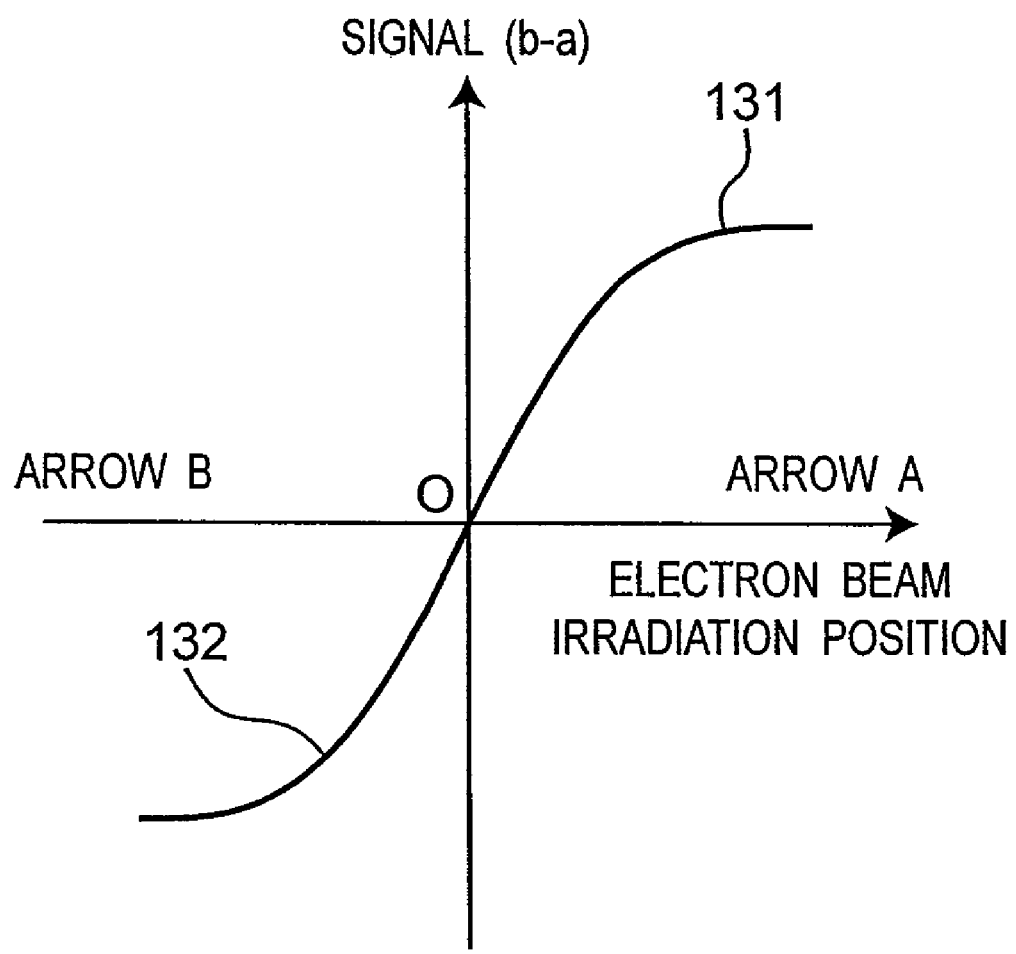
FIG. 5 is a graph showing relation between electron beam irradiation position and output of the electron beam irradiation position detecting unit of FIG. 2 in the electron beam recorder of FIG. 1.

FIGS. 4A, 4B and 4C show a normal position and deflections of the electron beam 120 in the electron beam irradiation position detecting unit 114. In FIG. 4A showing the normal position of the electron beam 120, the shielding plates 121 and 122 are provided such that the edges 121a and 122a of the shielding plates 121 and 122 are substantially brought into contact with the electron beam 120. When the electron beam detectors 123 and 124 have outputted the signals a and b, respectively as described above, a signal (b-a) varies as shown in FIG. 5 when an irradiation position of the electron beam 120 is deflected. FIG. 5 shows relation between the irradiation position of the electron beam 120 and the signal (b-a). For example, in FIG. 4A showing the normal position of the electron beam 120, since the irradiation position of the electron beam 120 is disposed at a center between the shielding plates 121 and 122 and the electron beam 120 is not shielded by both of the shielding plates 121 and 122, the output signals a and b from the electron beam detectors 123 and 124 assume zero substantially, so that the signal (b-a) assumes zero substantially as indicated by an origin O in FIG. 5.

On the other hand, in case the irradiation position of the electron beam 120 has been deflected from the normal position of FIG. 4A towards the shielding plate 122 in the direction of the arrow A as shown in FIG. 4B, the electron beam detector 124 provided on the shielding plate 122 outputs the signal b proportional to the quantity of the electron beam 120 shielded by the shielding plate 122, while the output signal a from the electron beam detector 123 provided on the shielding plate 121 assumes zero. Thus, the signal (b-a) shifts to a plus domain as indicated by a curve 131 in FIG. 5. On the contrary, in case the irradiation position of the electron beam 120 has been deflected from the normal position of FIG. 4A towards the shielding plate 121 in the direction of the arrow B as shown in FIG. 4C, the electron beam detector 123 provided on the shielding plate 121 outputs the signal a proportional to the quantity of the electron beam 120 shielded by the shielding plate 121, while the output signal b from the electron beam detector 124 provided on the shielding plate 122 assumes zero. Thus, the signal (b-a) shifts to a minus domain as indicated by a curve 132 in FIG. 5. Therefore, the position of the electron beam 120 can be detected from the values of the signal (b-a).

Meanwhile, the electron beam 120 having passed through the electron beam irradiation position detecting unit 114 without being shielded by the shielding plates 121 and 122 is irradiated on the master 109 so as to record the signals on the master. Accordingly, by using the electron beam irradiation position detecting unit 114, it is possible to detect variations of the position of the electron beam 120 in the electron optical system 102 while the electron beam 120 is being irradiated on the master 109 by the electron optical system 102.

Since variations of the track pitch recorded on the master 109 of the optical disc can be monitored by using the electron beam irradiation position detecting unit 114, it is possible as follows to judge, during recording, whether or not the variations of the track pitch recorded on the master 109 fall within a permissible range. For example, prior to recording on the master 109, the electron beam 120 is initially displaced greatly in the feed direction X of the horizontally traveling stage 111 by an electron beam deflecting member, e.g., the electrode 106 and a sample is recorded on a test master or the like while its change of the position of the electron beam 120 is being confirmed by the electron beam irradiation position detecting unit 114. By inspecting a shape of the recorded sample with an electron microscope or the like, correlation between amount of the change of the irradiation position of the electron beam 120 and the output signal of the electron beam irradiation position detecting unit 114 is grasped preliminarily. Here, the position of the electron beam 120 is varied greatly such that the amount of the change of the irradiation position of the electron beam 120 can be obtained from the shape of the recorded sample.

Supposing that the track pitch recorded on the master 109 is 0.32 μm and a permissible variation of the track pitch for the optical disc is ±5 nm, it is possible to beforehand convert, from results of recording on the test master, the output signal of the electron beam irradiation position detecting unit 114 obtained at the time the variations of the track pitch fall within the permissible range of ±5 nm. Thus, if the output signal of the electron beam irradiation position detecting unit 114 is monitored continuously during actual recording of the master 109 of the optical disc, it is possible to estimate whether or not the variations of the track pitch of the master 109 fall within the permissible range.

In the first embodiment, the electron beam irradiation position detecting unit 114 is provided in the electron optical system 102 and below the lens 108. Namely, in the electron optical system 102, the electron beam irradiation position detecting unit 114 is disposed at a location closest to the master 109. However, the electron beam irradiation position detecting unit 114 may also be provided at another location in the electron optical system 102. Nevertheless, in case the electron beam irradiation position detecting unit 114 monitors variations of radial position of the patterns recorded on the master 109, it is preferable that the electron beam irradiation position detecting unit 114 is disposed as close to the master 109 as possible.

Meanwhile, in the first embodiment, the edges 121a and 122a of the shielding plates 121 and 122 of the electron beam irradiation position detecting unit 114 are formed into a linear shape but may also have other shapes than the linear shape, e.g., a circular shape effectively.

Figure 6:
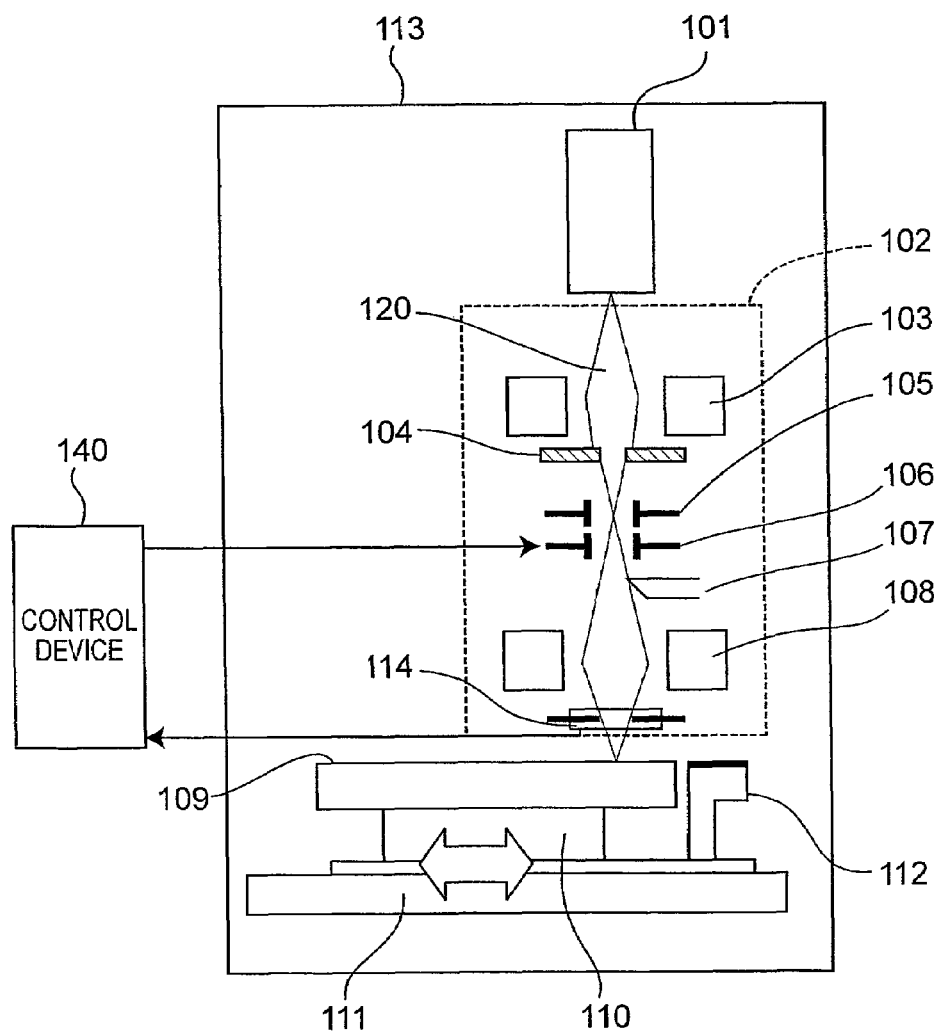
FIG. 6 is a schematic sectional view showing an arrangement of an electron beam recorder which is a modification of the electron beam recorder of FIG. 1.

Meanwhile, FIG. 6 shows an electron beam recorder which is a modification of the electron beam recorder of FIG. 1. This modified electron beam recorder includes a positional information control device 140 connected between the electron beam irradiation position detecting unit 114 and the electrode 106. By employing this arrangement of the electron beam recorder of FIG. 6, variations of the irradiation position of the electron beam 120 are restrained such that nonuniform feed of the patterns recorded on the master 109 can be lessened. As shown in FIG. 5, when there is no variation of the irradiation position of the electron beam 120, the zero-signal O indicated by the origin O is outputted as the electron beam irradiation position signal (b-a). When the electron beam 120 has been displaced towards the shielding plate 122, the plus signal 131 is outputted as the signal (b-a). On the contrary, when the electron beam 120 has been displaced towards the shielding plate 121, the minus signal 132 is outputted as the signal (b-a).

This signal (b-a) is inputted to the positional information control device 140 so as to be subjected to predetermined signal amplification or signal attenuation in the positional information control device 40 and then, is fed back to the deflection electrode 106. The deflection electrode 106 is capable of bending the electron beam 120 in the substantially same direction as the feed direction X of the horizontally traveling stage 111. Thus, if the electrode 106 bends, by using the electron beam positional variation information detected by the electron beam irradiation position detecting unit 114, the electron beam 120 in a direction for reducing positional variations of the electron beam 120, the irradiation position of the electron beam 120 can be stabilized. By this arrangement of the electron beam recorder of FIG. 6, variations of the optical disc track pitch recorded on the master 109, etc. can be corrected.

Second Embodiment

Figure 7:
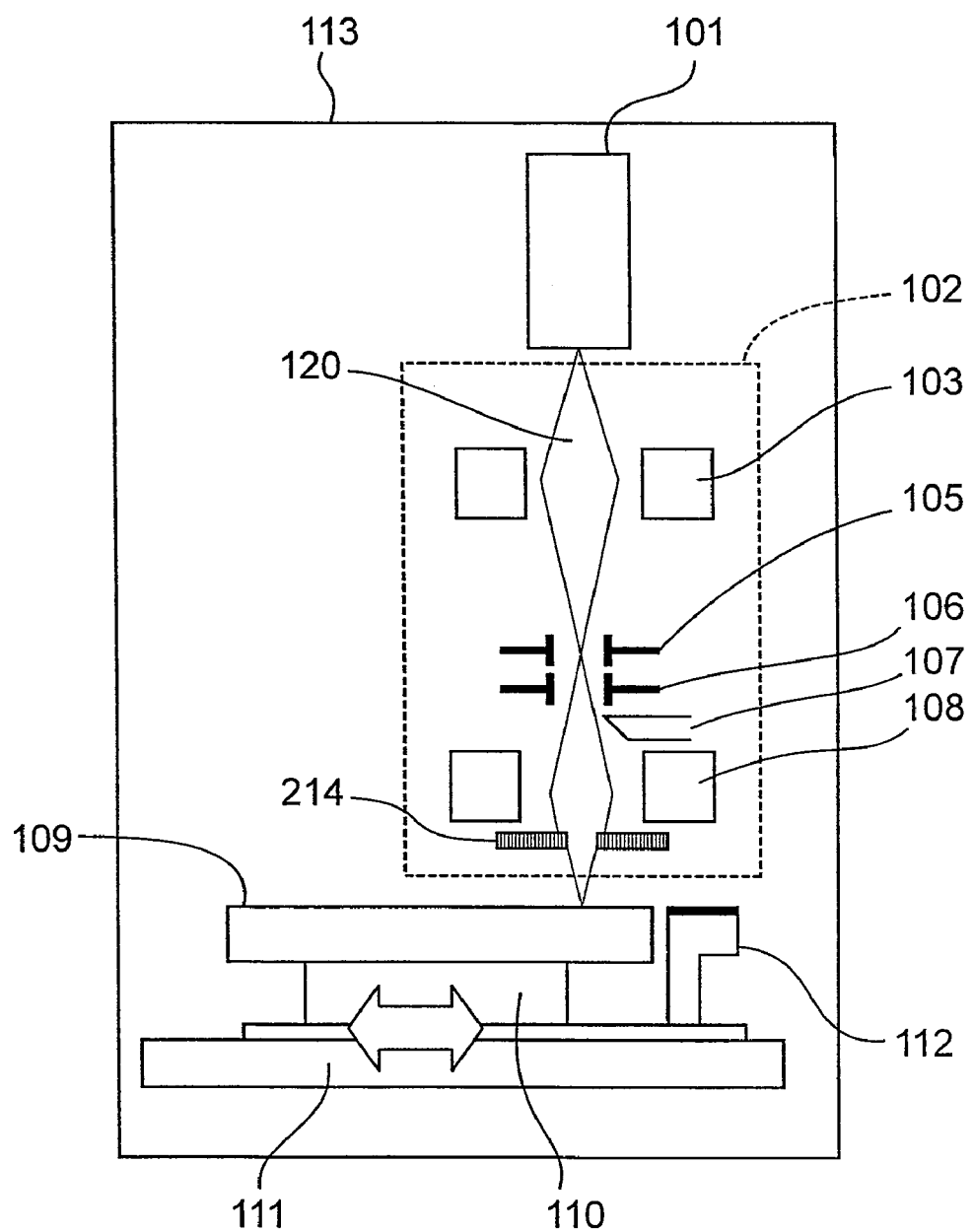
FIG. 7 is a schematic sectional view showing an arrangement of an electron beam recorder according to a second embodiment of the present invention.
Figure 8:
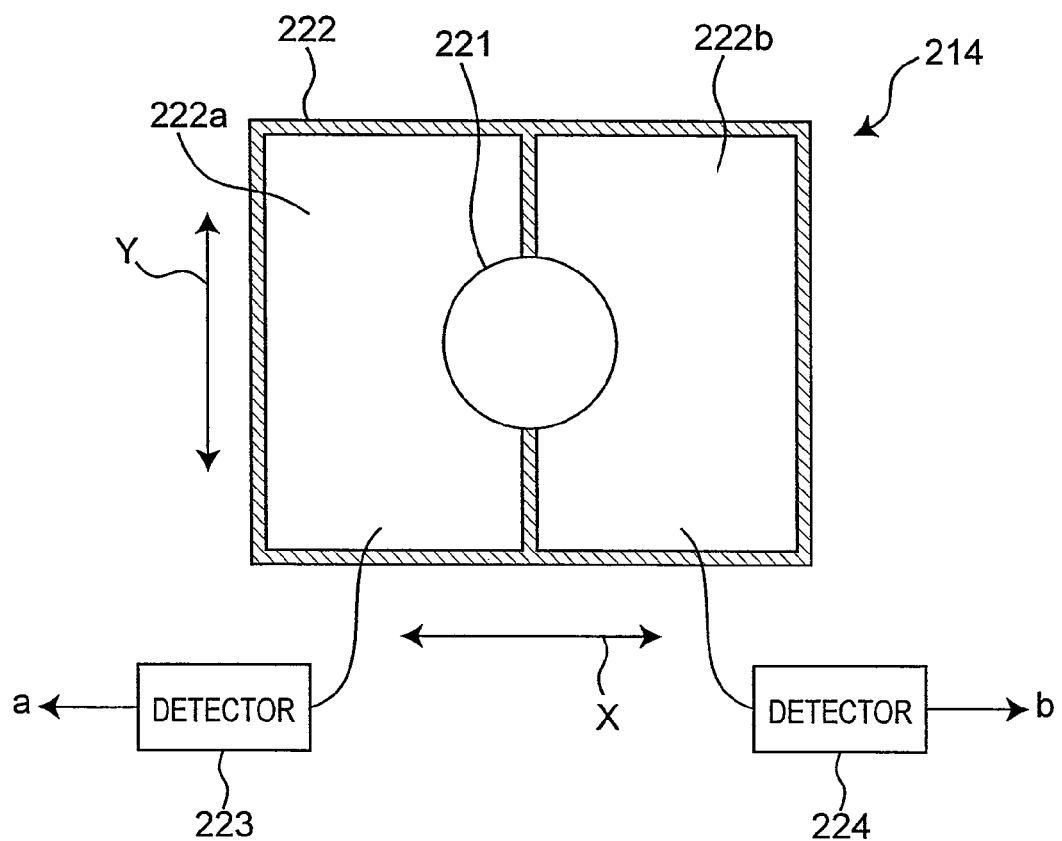
FIG. 8 is a top plan view showing an arrangement of an electron beam irradiation position detecting unit of the electron beam recorder of FIG. 7.

FIG. 7 shows an arrangement of an electron beam recorder according to a second embodiment of the present invention. In the electron beam recorder of the second embodiment, the aperture 104 of the electron beam recorder of the first embodiment is eliminated and the electron beam irradiation position detecting unit 114 of the electron beam recorder of the first embodiment is replaced by an electron beam irradiation position detecting unit 214. Since other constructions of the electron beam recorder of the second embodiment are similar to those of the electron beam recorder of the first embodiment, the description is abbreviated for the sake of brevity. As shown in FIG. 8, the electron beam irradiation position detecting unit 214 includes a shielding plate 222 and a hole 221 for determining a beam diameter of the electron beam 120 is provided at a center of the shielding plate 222 in the feed direction X of the horizontally traveling stage 111 and the rotational direction Y of the master 109.

When the electron beam 120 having the beam diameter larger than a diameter of the hole 221 is passed through the hole 221, an outer peripheral portion of the electron beam 120 is shielded by the shielding plate 222 such that the beam diameter of the electron beam 120 having passed through the hole 221 is determined. Meanwhile, the shielding plate 222 is bisected into a first region 222a and a second region 222b at the hole 221 in a direction substantially perpendicular to the feed direction X of the horizontally traveling stage 111 and electron beam detectors 223 and 224 are, respectively, connected to the first and second regions 222a and 222b so as to output signals a and b corresponding to quantities of the electron beam 120 irradiated on the first and second regions 222a and 222b, respectively.

Edges of the first and second regions 222a and 222b of the shielding plate 222, which surround the hole 221, have contours substantially identical with those of edges of the hole 221. When the electron beam 120 flowing through the hole 221 has been deflected towards the second region 222b, the signal (b-a) shifts to the plus domain as indicated by the curve 131 in FIG. 5. On the contrary, when the electron beam 120 flowing through the hole 221 has been deflected towards the first region 222a, the signal (b-a) shifts to the minus domain as indicated by the curve 132 in FIG. 5. When the output signals a and b from the electron beam detectors 223 and 224 have a substantially identical intensity, the signal (b-a) assumes zero substantially. Namely, by detecting the signal (b-a), position of the electron beam 120 irradiated on the electron beam irradiation position detecting unit 214 can be detected.

In the second embodiment, the hole 221 is formed into a circular shape but may also have other shapes than the circular shape, for example, a square, a rectangle and an ellipse.

Figure 9:
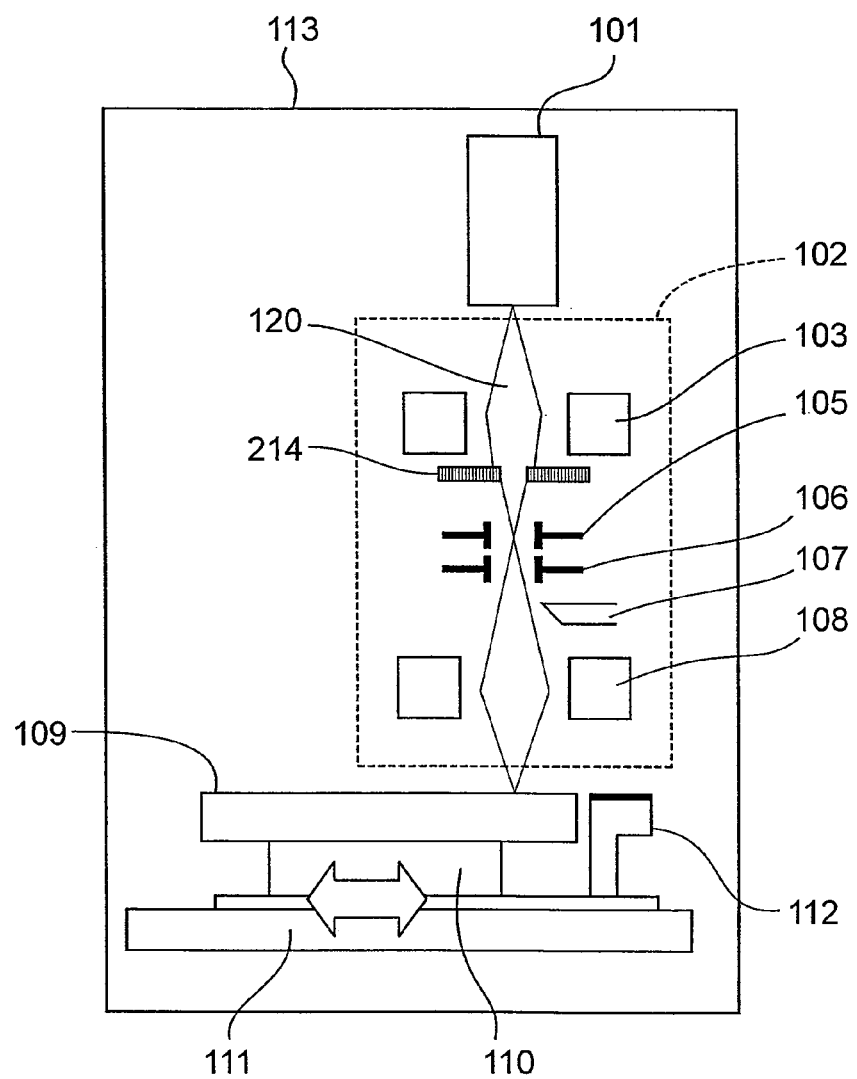
FIG. 9 is a schematic sectional view showing another example of layout of the electron beam irradiation position detecting unit of FIG. 8 in the electron beam recorder of FIG. 7.

Meanwhile, in the second embodiment, the electron beam irradiation position detecting unit 214 is provided, in the electron optical system 102, at a location closest to the master 109 but may also be disposed at any location in the electron optical system 102, for example, between the lens 103 and the electrode 105 as shown in FIG. 9. However, usually, it is preferable that the electron beam irradiation position detecting unit 214 is disposed as close to the master 109 as possible.

Since variations of the track pitch recorded on the master 109 of the optical disc can be monitored by using the electron beam irradiation position detecting unit 214, it is possible to judge, during recording, whether or not the variations of the track pitch recorded on the master 109 fall within a permissible range.

Meanwhile, if the electron beam irradiation position signal (b-a) outputted by the electron beam irradiation position detecting unit 214 is fed back to the deflection electrode 106 capable of bending the electron beam 120 in the feed direction X of the horizontally traveling stage 111, variations of the irradiation position of the electron beam 120 can be restrained.

Third Embodiment

Figure 10:
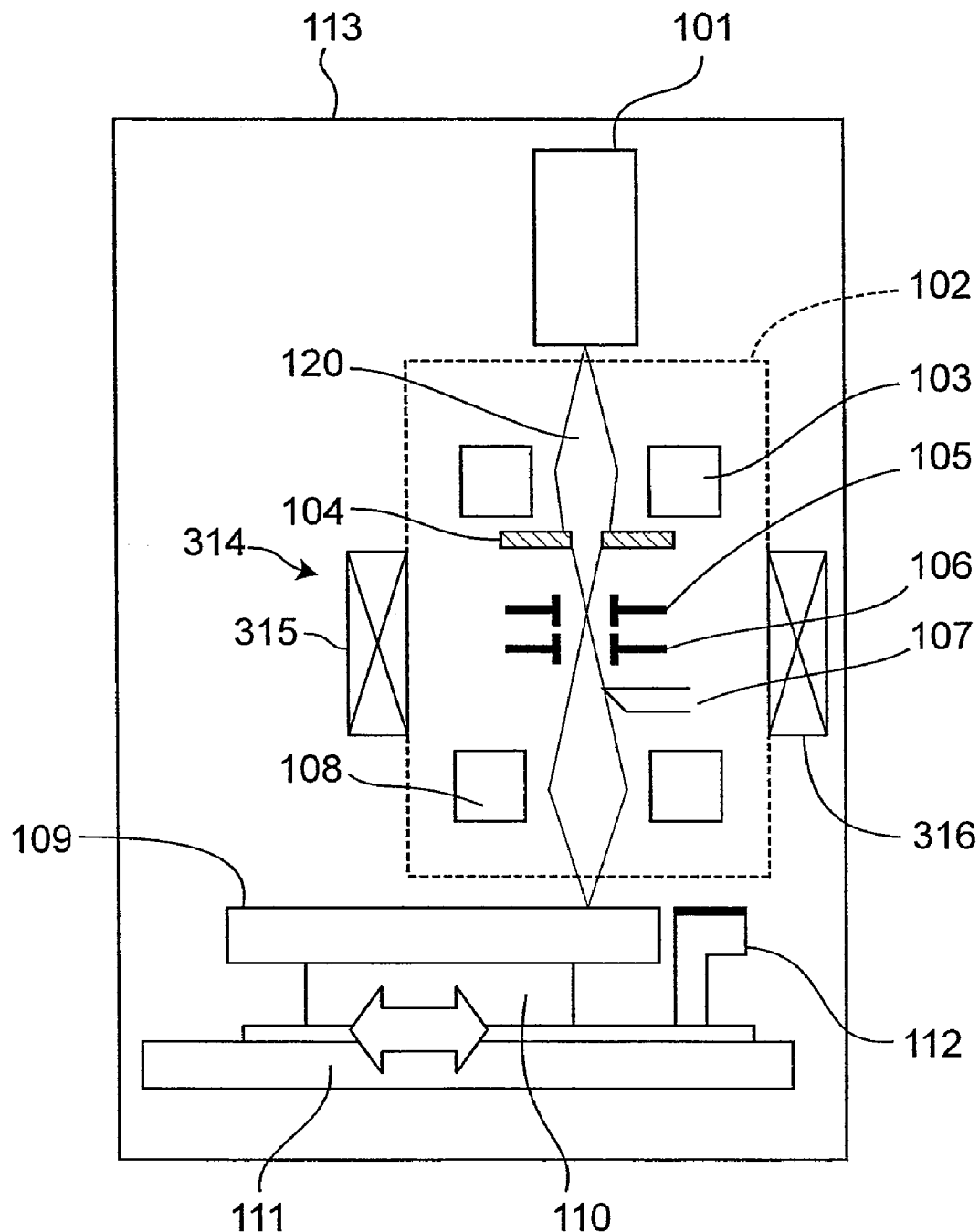
FIG. 10 is a schematic sectional view showing an arrangement of an electron beam recorder according to a third embodiment of the present invention.

FIG. 10 shows an arrangement of an electron beam recorder according to a third embodiment of the present invention. In the electron beam recorder of the third embodiment, the electron beam irradiation position detecting unit 114 of the electron beam recorder of the first embodiment is replaced by an electron beam irradiation position detecting unit 314. Since other constructions of the electron beam recorder of the third embodiment are similar to those of the electron beam recorder of the first embodiment, the description is abbreviated for the sake of brevity. The electron beam irradiation position detecting unit 314 includes magnetic field sensors 315 and 316 for detecting intensity of magnetic field generated about a central axis located at an optical axis of the electron beam 120 in the electron optical system 102. The magnetic field sensors 315 and 316 each formed by a coil are spaced a substantially identical distance from the optical axis of the electron beam 120 and confront each other in the feed direction X of the horizontally traveling stage 111 so as to have the optical axis of the electron beam 120 as a center therebetween.

The intensity of the magnetic field generated by the electron beam 120 running between the magnetic field sensors 315 and 316 is determined by a distance from the optical axis of the electron beam 120. As a distance from the optical axis of the electron beam 120 to the magnetic field increases, the intensity of the magnetic field decreases. Thus, in case the electron beam 120 passes through a substantially central position between the magnetic field sensors 315 and 316, a quantity of electric current flowing through the magnetic field sensor 315 becomes substantially identical with that of the magnetic field sensor 316. However, if the electron beam 120 is deflected from the central position between the magnetic field sensors 315 and 316, the quantity of electric current flowing through the magnetic field sensor 315 becomes different from that of the magnetic field sensor 316.

Figure 11:
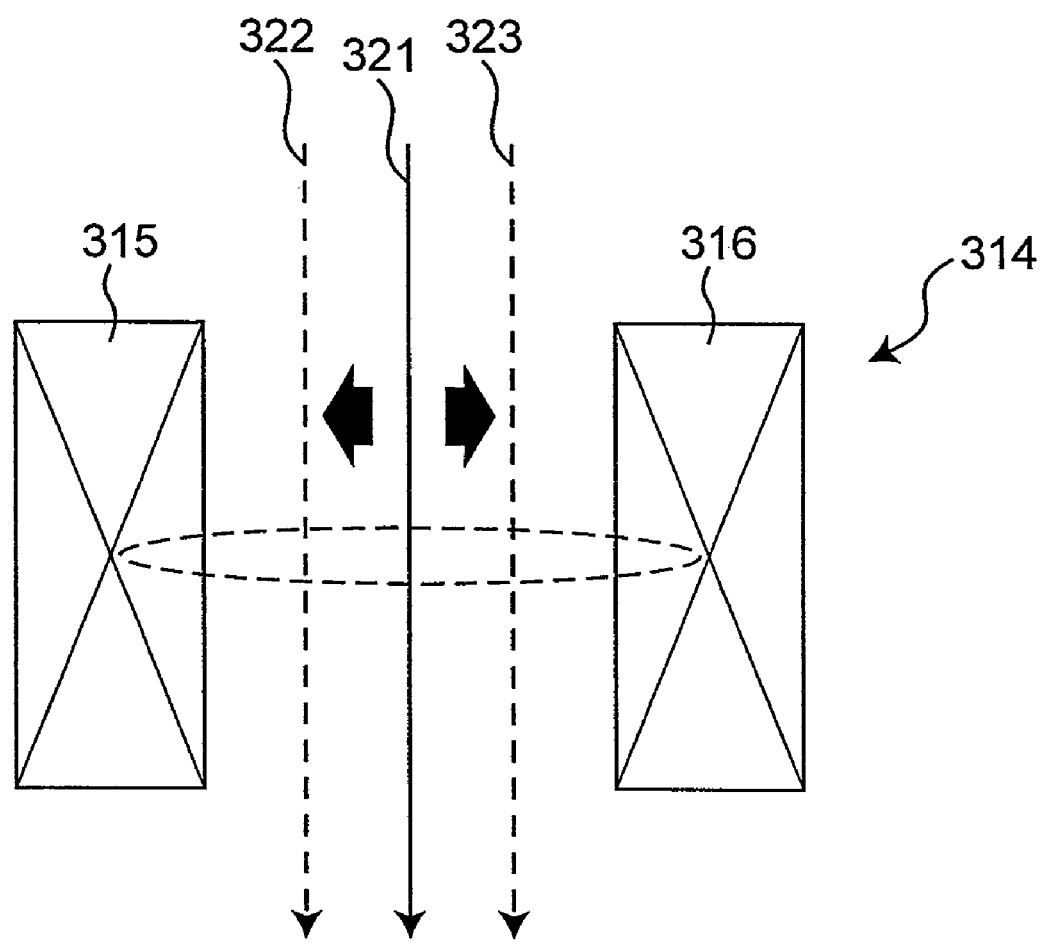
FIG. 11 is a diagram showing positional relation between an electron beam and two magnetic field sensors employed in an electron beam irradiation position detecting unit of the electron beam recorder of FIG. 10.

FIG. 11 shows positional relation between the electron beam 120 and the magnetic field sensors 315 and 316. The magnetic field sensors 315 and 316 are disposed symmetrically with respect to a position 321 of the electron beam 120 as a center therebetween. In case the electron beam 120 flows at the position 321, quantities of electric current generated in the magnetic field sensors 315 and 316 are set to be substantially identical with each other. Thus, if the electron beam 120 has been deflected from the position 321 to a position 322, the magnetic field sensor 315 comes closer to the electron beam 120, while the magnetic filed sensor 316 lies farther from the electron beam 120. The magnetic field generated by the electron beam 120 is inversely proportional to a distance from the electron beam 120. Thus, a quantity of electric current generated in the magnetic field sensor 315 becomes larger than that of the magnetic field sensor 316. On the contrary, if the electron beam 120 has been deflected from the position 321 to a position 323, the quantity of electric current generated in the magnetic field sensor 315 becomes smaller than that of the magnetic field sensor 316. Namely, by monitoring the quantities of electric current outputted from the magnetic field sensors 315 and 316, it is possible to detect position of the optical axis of the electron beam 120 flowing between the magnetic field sensors 315 and 316.

As described above, the two magnetic field sensors 315 and 316 are provided as the electron beam irradiation position detecting unit 314 so as to be disposed symmetrically with respect the optical axis of the electron beam 120. Thus, even if a quantity of the electron beam 120 has changed, it is possible to detect a deviation of the electron beam 120 from the central position 321 by taking a difference signal of outputs of the magnetic field sensors 315 and 316.

Here, the two magnetic field sensors 315 and 316 are disposed symmetrically with respect to the optical axis of the electron beam 120. However, in case the magnetic field sensors 315 and 316 are provided at locations passing through the optical axis of the electron beam 120 and lying in parallel with the feed direction X of the horizontally traveling stage 111, the magnetic field sensors 315 and 316 are capable of detecting position of the electron beam 120 even if the magnetic filed sensors 315 and 316 are not spaced an identical distance from the optical axis of the electron beam 120. Meanwhile, even a single magnetic field sensor is capable of detecting position of the electron beam 120.

In the third embodiment, each of the magnetic field sensors 315 and 316 is formed by the coil but a sensor capable of detecting variations of the magnetic field may also achieve the same effect as the coil.

Since variations of the track pitch recorded on the master 109 of the optical disc can be monitored by using the electron beam irradiation position detecting unit 314, it is possible to judge, during recording, whether or not the variations of the track pitch recorded on the master 109 fall within a permissible range.

Meanwhile, if an electron beam irradiation position signal outputted by the electron beam irradiation position detecting unit 314 is fed back to the deflection electrode 106 capable of bending the electron beam 120 in the feed direction X of the horizontally traveling stage 111, variations of the irradiation position of the electron beam 120 can be restrained.

Fourth Embodiment

Figure 12:
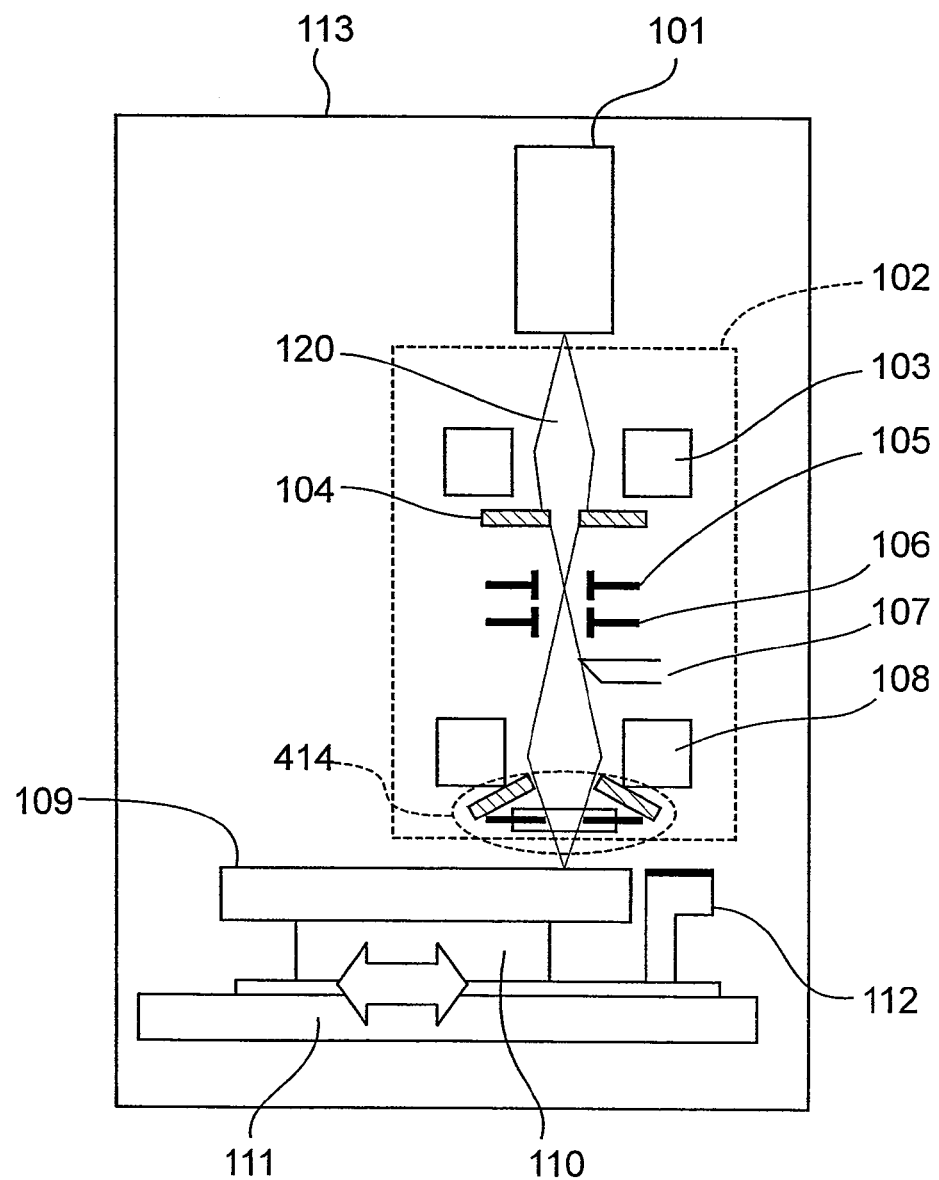
FIG. 12 is a schematic sectional view showing an arrangement of an electron beam recorder according to a fourth embodiment of the present invention.
Figure 13:
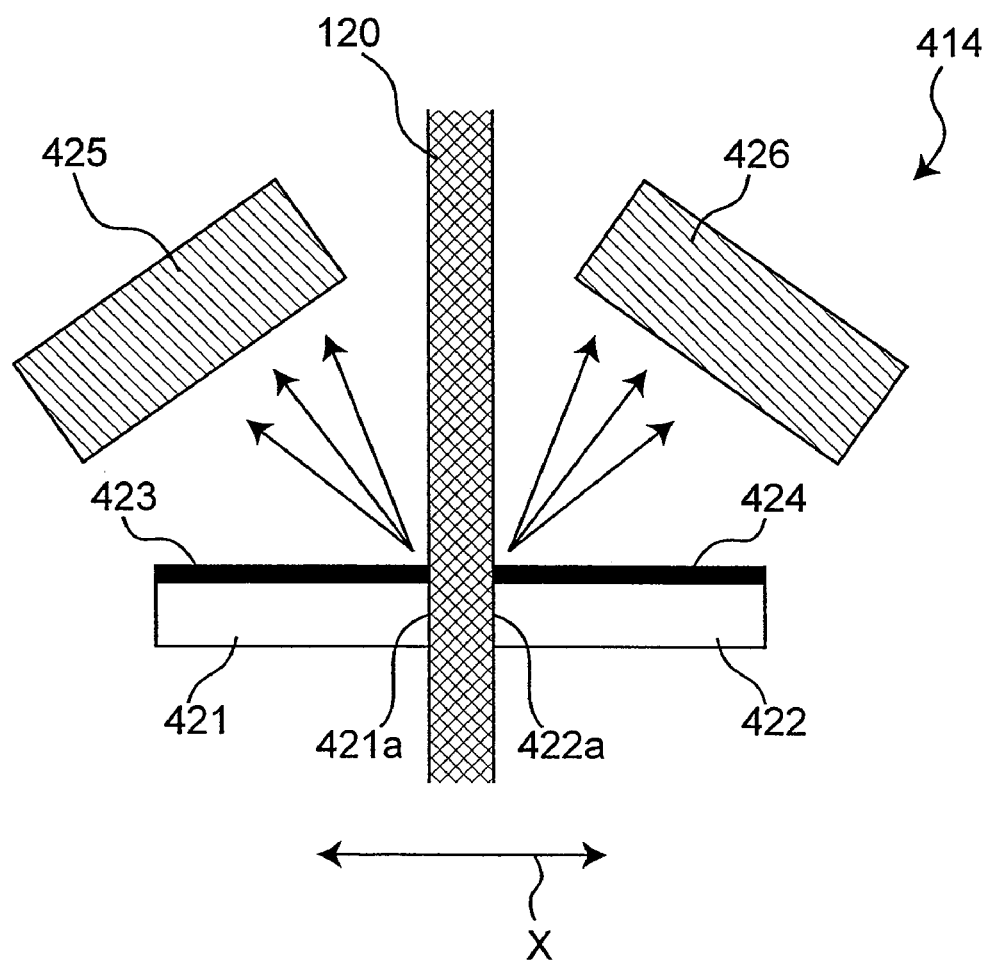
FIG. 13 is a schematic sectional view showing an arrangement of an electron beam irradiation position detecting unit of the electron beam recorder of FIG. 12.

FIG. 12 shows an arrangement of an electron beam recorder according to a fourth embodiment of the present invention. In the electron beam recorder of the fourth embodiment, the electron beam irradiation position detecting unit 114 of the electron beam recorder of the first embodiment is replaced by an electron beam irradiation position detecting unit 414. Since other constructions of the electron beam recorder of the fourth embodiment are similar to those of the electron beam recorder of the first embodiment, the description is abbreviated for the sake of brevity. As shown in FIG. 13, the electron beam irradiation position detecting unit 414 includes shielding plates 421 and 422 which confront each other in the feed direction X of the horizontally traveling stage 111 so as to have the optical axis of the electron beam 120 in the electron optical system 102 as a center therebetween and are substantially brought into contact with the electron beam 120, luminescent layers 423 and 424 made of, for example, fluorescent substance, which emit light upon irradiation of the electron beam 120 thereon and are, respectively, coated on the shielding plates 421 and 422 and photosensors 425 and 426 for detecting intensities of light emitted from the luminescent layers 423 and 424, respectively, which are disposed above the shielding plates 421 and 422 so as to be directed towards the fluorescent layers 423 and 424, respectively.

The shielding plates 421 and 422 have, respectively, edges 421a and 422a extending in a direction substantially perpendicular to the feed direction X of the horizontally traveling stage 111. The shielding plates 421 and 422 are provided in the feed direction X of the horizontally traveling stage 111 such that the respective edges 421a and 422a are substantially brought into contact with the electron beam 120 passing through the electron beam irradiation position detecting unit 414.

When the electron beam 120 has been deflected in the feed direction X of the horizontally traveling stage 111 due to variations of ambient magnetic field or mechanical vibrations and electrical noise of the electron beam recorder, a portion of the electron beam 120 is irradiated on the shielding plate 421 or 422, so that light is emitted from the luminescent layer 423 or 424 coated on the shielding plate 421 or 422. By detecting a quantity of the emitted light with the photosensor 425 or 426, it is possible to detect a direction and an amount of deflection of the electron beam 120.

Meanwhile, in the fourth embodiment, the electron beam irradiation position detecting unit 414 is provided, in the electron optical system 102, at a location closest to the master 109 but may also be disposed at another location in the electron optical system 102. However, usually, it is preferable that the electron beam irradiation position detecting unit 414 is disposed as close to the master 109 as possible.

Since variations of the track pitch recorded on the master 109 of the optical disc can be monitored by using the electron beam irradiation position detecting unit 414, it is possible to judge, during recording, whether or not the variations of the track pitch recorded on the master 109 fall within a permissible range.

Meanwhile, if an electron beam irradiation position signal outputted by the electron beam irradiation position detecting unit 414 is fed back to the deflection electrode 106 capable of bending the electron beam 120 in the feed direction X of the horizontally traveling stage 111, variations of the irradiation position of the electron beam 120 can be restrained.

Fifth Embodiment

Figure 14:
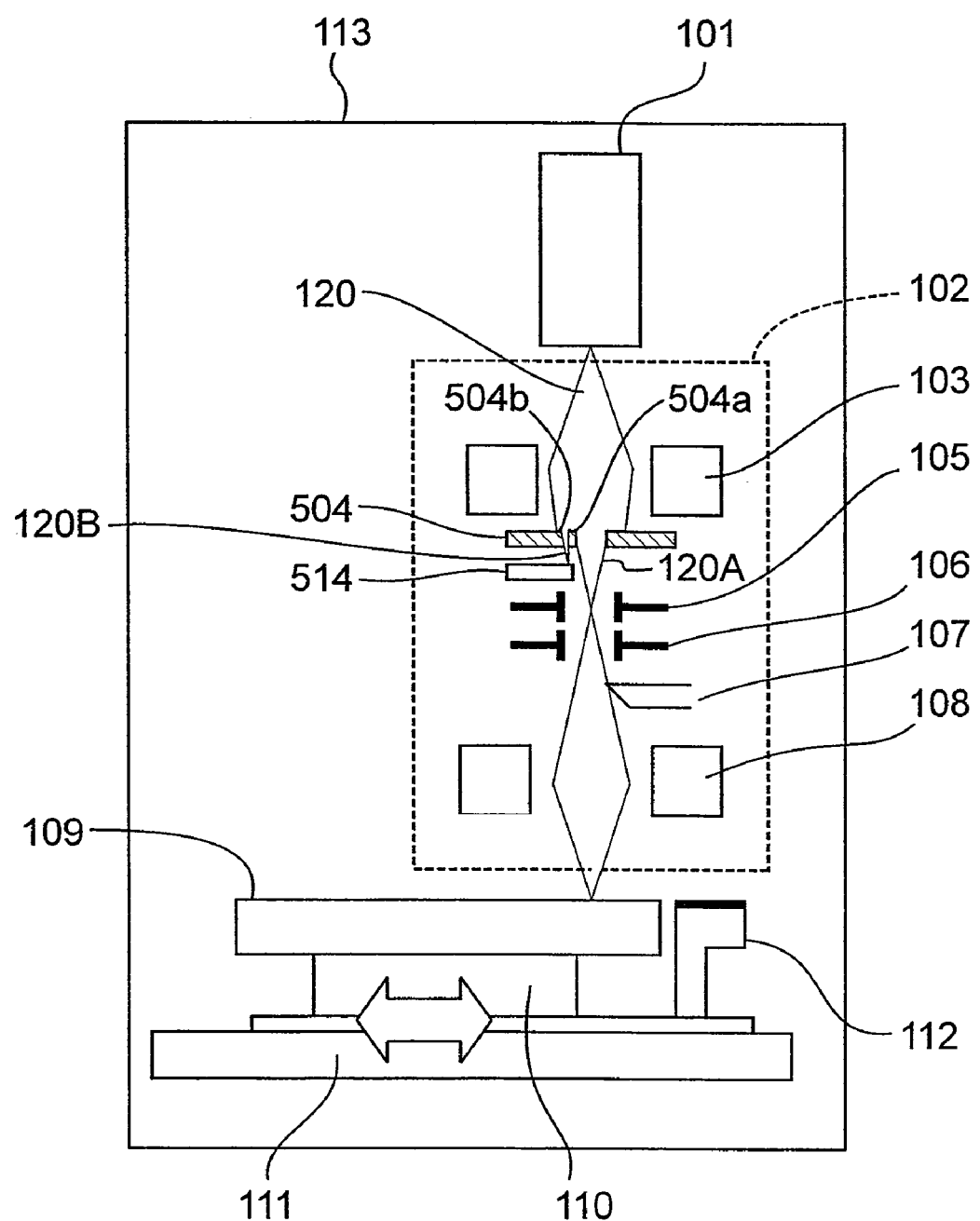
FIG. 14 is a schematic sectional view showing an arrangement of an electron beam recorder according to a fifth embodiment of the present invention.

FIG. 14 shows an arrangement of an electron beam recorder according to a fifth embodiment of the present invention. In the electron beam recorder of the fifth embodiment, the aperture 104 and the electron beam irradiation position detecting unit 114 of the electron beam recorder of the first embodiment are, respectively, replaced by an aperture 504 and an electron beam irradiation position detecting unit 514. In contrast with the electron beam irradiation position detecting unit 114 provided below the lens 108 in the electron beam recorder of the first embodiment, the electron beam irradiation position detecting unit 514 is disposed immediately below the aperture 504. Since other constructions of the electron beam recorder of the fifth embodiment are similar to those of the electron beam recorder of the first embodiment, the description is abbreviated for the sake of brevity. As shown in FIG. 14, the aperture 504 has holes 504a and 504b for bifurcating the electron beam 120 from the electron beam source 101 into a main electron beam portion 120A and a branch electron beam portion 120B, respectively. The main electron beam portion 120A is passed through the electron optical system 102 as it is and is irradiated on the master 109 so as to record patterns on the master 109, while the branch electron beam portion 120B is inputted to the electron beam irradiation position detecting unit 514.

Any one of the electron beam irradiation position detecting unit 114 of the first embodiment, the electron beam irradiation position detecting unit 214 of the second embodiment and the electron beam irradiation position detecting unit 414 of the fourth embodiment may be used as the electron beam irradiation position detecting unit 514.

In the electron beam recorder of the above described arrangement, in case the main electron beam portion 120A used for recording is deflected by variations of external magnetic field or mechanical vibrations, the branch electron beam portion 120B may also be deflected likewise. Thus, if correlation between positional variations of the main electron beam portion 120A and those of the branch electron beam portion 120B is taken prior to recording of the patterns on the master 109, it becomes possible to detect variations of the irradiation position of the electron beam 120 while the patterns are being recorded on the master 109 by the electron beam 120.

Since variations of the track pitch recorded on the master 109 of the optical disc can be monitored by using the electron beam irradiation position detecting unit 514, it is possible to judge, during recording, whether or not the variations of the track pitch recorded on the master 109 fall within a permissible range.

Meanwhile, if an electron beam irradiation position signal outputted by the electron beam irradiation position detecting unit 514 is fed back to the deflection electrode 106 capable of bending the electron beam 120 in the feed direction X of the horizontally traveling stage 111, variations of the irradiation position of the electron beam 120 can be restrained.

As is clear from the foregoing description of the present invention, by using the electron beam irradiation position detecting unit, variations of the irradiation position of the electron beam can be detected while the electron beam is being irradiated on the master so as to record the patterns on the master. Thus, during recording on the master, it is possible to judge whether or not the variations of the track pitch recorded on the master fall within the permissible range. Meanwhile, by driving the deflection electrode by using the signal of the electron beam irradiation position detecting unit, it becomes possible to restrain the variations of the track pitch recorded on the master.

What is claimed:

1. An electron beam recorder comprising:
   an electron optical system for irradiating an electron beam on a master of an information recording medium; and
   an electron beam irradiation position detecting unit for detecting an irradiation position of the electron beam in the electron optical system while the electron beam is being irradiated on the master by the electron optical system, the electron beam irradiation position detecting unit including:
      a shielding plate for shielding the electron beam, which has a hole for shaping the electron beam to a desired beam diameter and is divided, at the hole, into first and second regions in a direction substantially perpendicular to a horizontal feed direction of the master; and
      first and second electron beam detectors for detecting, as first and second detection signals, quantities of the electron beam shielded by the first and second regions of the shielding plate, respectively such that a difference signal of the first and second detection signals is obtained.

2. A method of detecting, in an electron beam recorder for recording signals on a master of an information recording medium by an electron beam, an irradiation position of the electron beam, comprising the steps of:

irradiating the electron beam on the master so as to record information on the master;

shielding the irradiated electron beam with a shielding plate which is divided into first and second regions detecting quantities of the electron beam shielded by the first and second regions of the shielding plate; and generating first and second detection signals based on the quantities of the election beam shielded by the first and second regions of the shielding plate, respectively, such that the position of the electron beam is detected by a difference signal of the first and second detection signals.

* * * * *